United States Patent [19]
Viot et al.

[11] Patent Number: 6,034,921
[45] Date of Patent: Mar. 7, 2000

[54] METHOD, APPARATUS, PAGER, AND CELLULAR TELEPHONE FOR ACCESSING INFORMATION FROM A MEMORY UNIT UTILIZING A SEQUENTIAL SELECT UNIT

[75] Inventors: James Gregory Viot; Avinash Palaniswamy, both of Austin, Tex.

[73] Assignee: Motorola, Inc., Schaumburg, Ill.

[21] Appl. No.: 08/979,739

[22] Filed: Nov. 26, 1997

[51] Int. Cl.[7] .................................................. G11C 8/00
[52] U.S. Cl. ...................... 365/239; 365/207; 365/230.06
[58] Field of Search ................................. 365/239, 207, 365/230.06

[56] References Cited

U.S. PATENT DOCUMENTS

| | | | |
|---|---|---|---|
| 4,773,049 | 9/1988 | Takemae ................................. | 365/239 |
| 4,802,134 | 1/1989 | Tsujimoto ............................... | 365/239 |
| 5,239,346 | 8/1993 | Nakajima et al. ....................... | 365/239 |
| 5,305,281 | 4/1994 | Lubeck .................................... | 365/239 |
| 5,363,337 | 11/1994 | Reinberg ................................ | 365/239 |
| 5,559,738 | 9/1996 | Mizobata et al. ....................... | 365/239 |

OTHER PUBLICATIONS

Neil H. E. Weste, Kamran Eshraghian, Principles of CMOS VLSI Design—A Systems Perspective, Addison–Wesley Publishing Company 1994. pp. 563–564.

*Primary Examiner*—David Nelms
*Assistant Examiner*—Tuan T. Nguyen
*Attorney, Agent, or Firm*—K. Cyrus Khosravi

[57] ABSTRACT

A method, pager, cellular telephone, and apparatus (24) that includes a central processing unit (10) for providing at least one addressing signal, a change of flow signal, and a memory request signal; and at least one memory unit (12) having a memory cell array (14). When the memory request signal is asserted, the at least one memory unit (12) sequentially selects a plurality of memory cells in the memory cell array (14) for accessing information therein, and when the change of flow signal is asserted, the sequential selection of the plurality of memory cells by the at least one memory unit (12) is inhibited and a predetermined memory cell is selected, determined by the at least one addressing signal, for accessing information in the predetermined memory cell.

6 Claims, 7 Drawing Sheets

METHOD, APPARATUS, PAGER, AND CELLULAR TELEPHONE FOR ACCESSING INFORMATION FROM A MEMORY UNIT UTILIZING A SEQUENTIAL SELECT UNIT

FIELD OF THE INVENTION

The present invention generally relates to accessing information from a memory unit and more particularly, to accessing information from a memory array utilizing a sequential select unit.

BACKGROUND OF THE INVENTION

Many electronic devices include a set of basic components for processing information, namely, a central processing unit (CPU) 10 and a memory unit 12. FIGS. 1 and 2 show a typical CPU 10 and memory interface. Conventionally, the CPU 10 accesses the memory unit 12 by supplying addressing signals, memory requests and read/write control signals. As shown in FIG. 1, the address lines from the CPU 10 provide the address information in the form of addressing signals to be decoded by the memory unit 12. The control lines from the CPU 10 provide the memory request and the read/write signals to the memory unit 12. The memory unit 12 generally includes a memory cell array 14 which can be arranged in a 1, 2, or 3-dimensional structure. For a 2-dimensional array structure, the memory cells can be arranged in a number of rows and columns. Each cell of the memory unit 12 can be implemented to accommodate various size data, for example, bit, nibble, byte, word, etc. Generally, a memory unit 12 can be a RAM, ROM, EEPROM, FLASH, or some other type of memory structure as is known in the art. A memory unit 12, in addition to having memory cells, contains an address decode unit 16 which generally consists of a row decode block 18 and a column decode block 20. The CPU 10, in conjunction with the address decode unit, can uniquely address any memory cell location within the memory cell array 14. A memory access can be implemented by using the address decode unit to decode the address information received from the CPU 10 and thereby cause one row select signal and one column select signal to be asserted. Hence, any particular memory cell can be selectably addressable and accessed by a particular row/column pair of select signals.

As mentioned above, the control lines from the CPU 10 include a read/write signal and a memory request signal. The control signals indicate the operation of reading from or writing to an addressable memory cell unit within the memory unit 12. For example, if the read/write signal indicates a "read", then data is transferred using the data lines from memory unit 12 to the CPU 10, and if the read/write signal indicates a "write" signal then data is transferred from the CPU 10 to the memory unit 12. As shown in FIG. 1, data can be transferred using the data lines from the CPU 10 to the memory unit 12 and vice versa.

It is important to note that with each memory access, both the row decode block 18 and column decode block 20 are active and performing power-consuming transitioning operations within the circuitry of the respective blocks. As the CPU 10 executes a program from memory, the address lines feeding the row/column decode blocks 20 change with each memory access. As address lines change, transistor switching occurs within the address decode logic (not shown) of the address decode unit 16. The transistor switching causes power to be consumed. In other words, power is consumed with each memory access as a result of address decoding. In addition, power is consumed by driving the address lines from the CPU 10 to the memory unit 12 and any peripheral modules.

FIG. 3 is a schematic representation of an electronic device 22, wherein a CPU 10 and a plurality of memory units 10 and peripheral modules 13 are utilized. As shown in FIG. 3, it is evident that the multiplication of memory units 10 and peripheral modules 13 in an electronic device results in further increase in power consumption and reduction in the speed of information transfer/processing in the electronic device 22.

Thus, there is a need to provide a more power-efficient, faster, and robust memory access in electronic devices by reducing the frequency of driving the address lines and propagating addressing signals through decode logic of memory units.

DETAILED DESCRIPTION OF A PREFERRED EMBODIMENT(S)

Conventionally, in electronic devices having a CPU 10 and a memory arrangement, a memory request signal is originated from the CPU 10 to the memory unit 12 prompting a request for accessing information from or to the memory unit 12. Moreover, the CPU 10 provides the addressing information to the memory unit 12 for addressing a location of a memory cell within a memory cell array 14. Once the desired memory cell is located, the CPU 10 through the data lines either reads information from or writes information to the desired memory cell. As the addressing and transfer of information operations are implemented between the CPU 10 and the memory unit 12, the address lines are asserted/changed and the logic elements (not shown) in the address decode unit 16 are activated. The logic elements in the address decode unit 16 are generally transistors and other types of active components that consume power. Furthermore, the address lines are driven by active elements such as buffers that consume electrical power. Hence, it is advantageous to provide an apparatus that minimizes power consumption and further increases the speed of information transfer between the CPU 10 and the memory unit 12.

Figure 1:
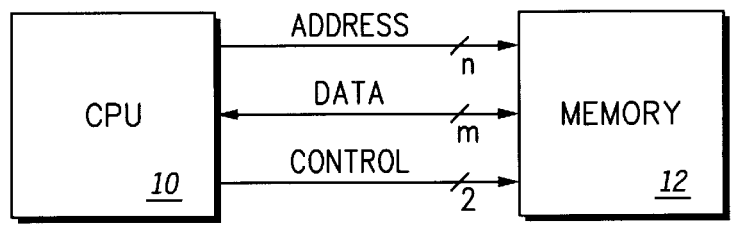
FIG. 1 is schematic block diagram of the components of a conventional electronic device.
Figure 2:
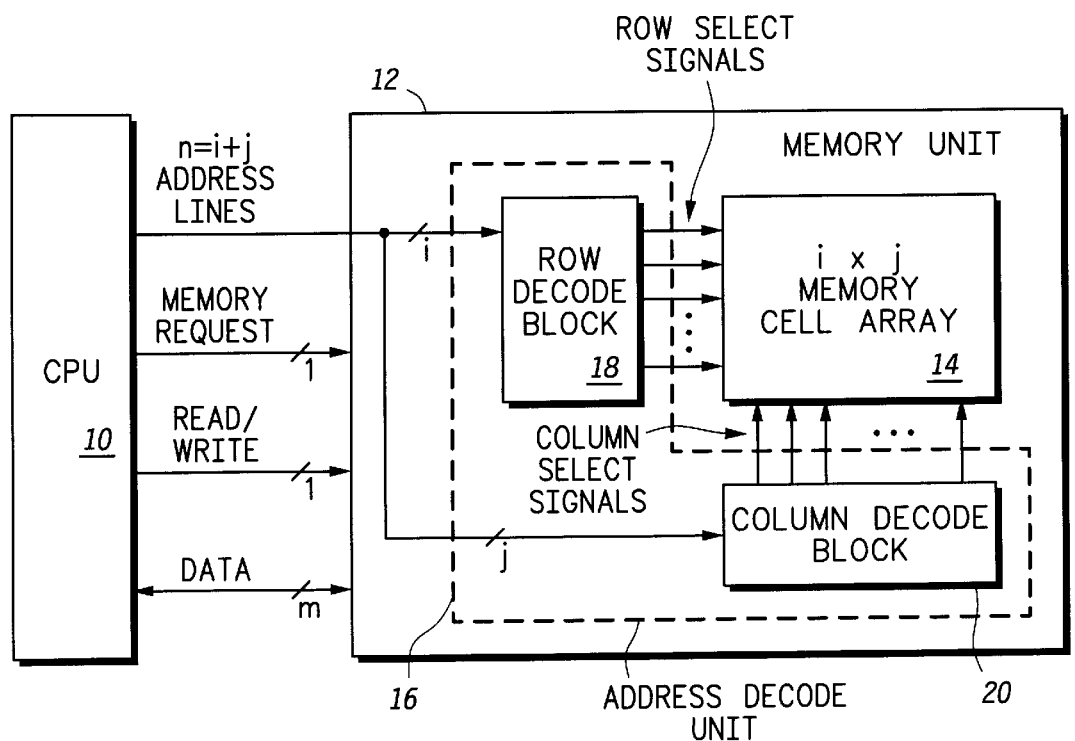
FIG. 2 is a detailed schematic block diagram of the components of a conventional electronic device shown in FIG. 1.
Figure 3:
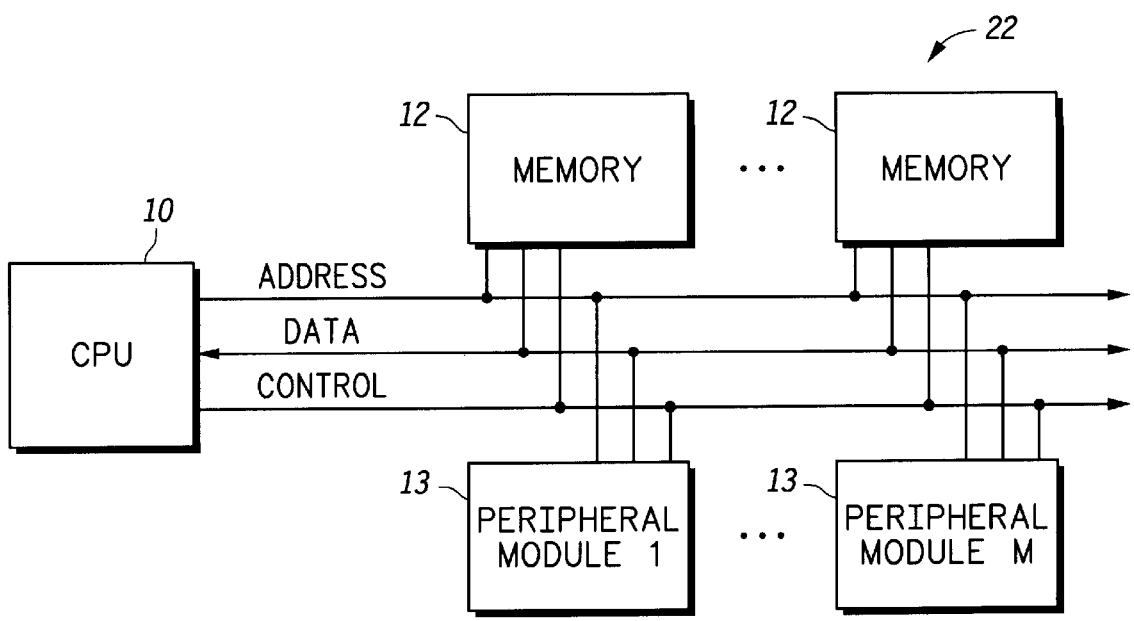
FIG. 3 is schematic block diagram of a conventional electronic device having a plurality of memory and peripheral modules.
Figure 4:
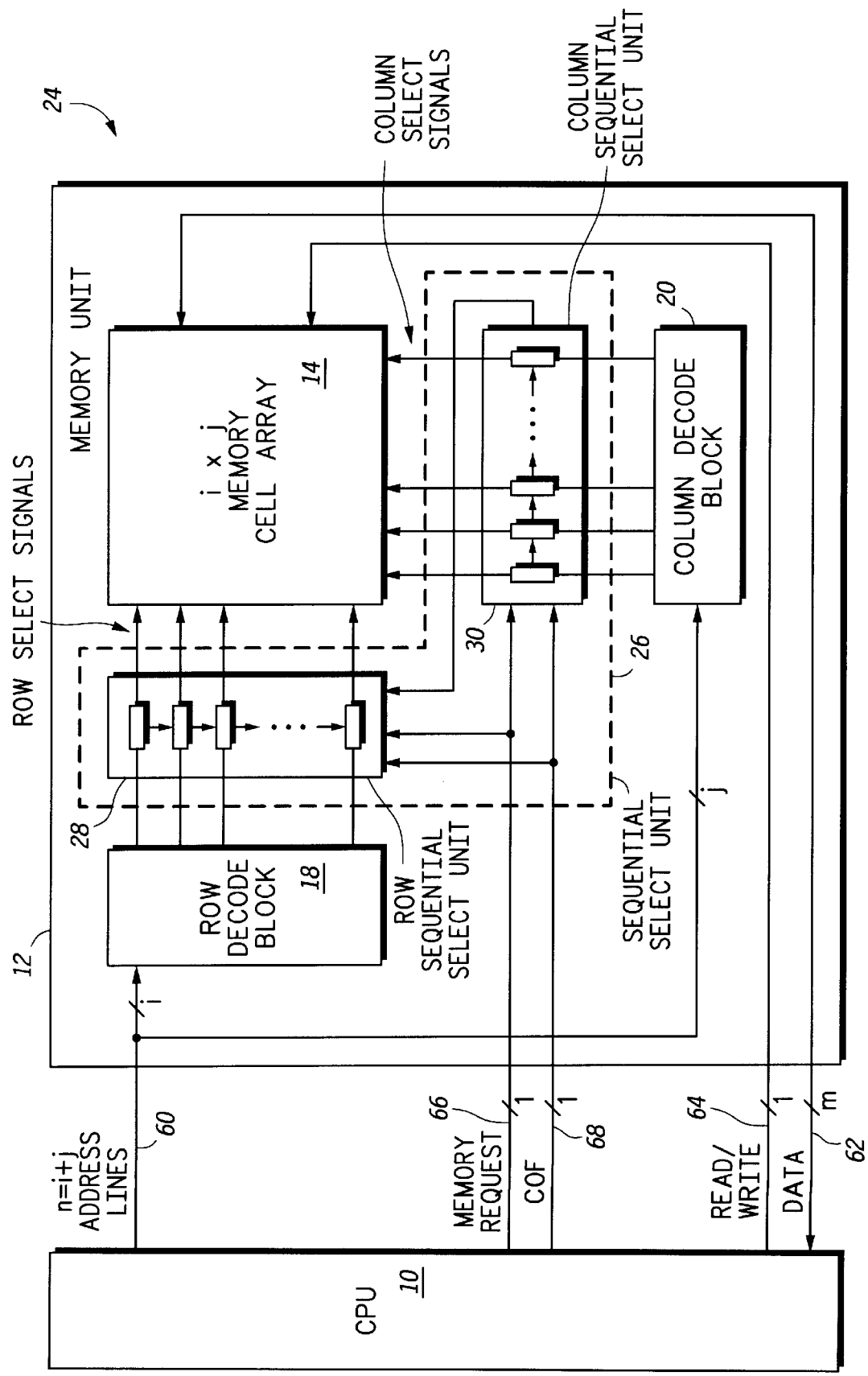
FIG. 4 is a schematic representation of an apparatus in accordance with the present invention.

The present invention addresses the above-identified need to provide a more power-efficient, faster, and robust memory access in electronic devices. Referring to FIG. 4, a block diagram of an illustrative embodiment of an apparatus 24 is illustrated in accordance with the present invention. The apparatus 24 includes a central processing unit 10, a memory unit 12 comprising a memory cell array 14, an address decode unit 16 comprising a row decode block 18 and a column decode block 20, and a sequential select unit 26. In the present embodiment of the present invention, there are generally three sets of lines interconnecting the CPU 10 and the memory unit 12. The first set of lines are the address lines 60. The second set of lines are the control lines. The third set of lines are the data lines 62. In this embodiment, the control lines include a read/write line 64, a memory request line 66, and a change of flow (COF) line 68.

It has been realized that in most electronic devices having a CPU-memory unit arrangement, more than half of the memory accessing operations by the CPU 10 are sequential. In other words, in more than half of the instances that the memory unit 12 is accessed, the memory cell location being addressed is immediately adjacent to the cell location having been addressed in the immediately previous memory access operation. Realizing the mostly sequential nature of CPU-memory access in the electronic devices, the apparatus 24 of the present invention provides for a memory access arrangement wherein the memory unit 12 automatically and sequentially accesses the memory cells with each memory request signal from the CPU 10 until the COF signal is asserted for a non-sequential accessing operation. Examples of non-sequential accessing operation are a branch instruction in a program and data accesses requiring random accesses to a predetermined memory cell location. Furthermore, examples of sequential accessing include fetches to program memory and indexing through data arrays. During the sequential accesses of the memory unit 12, the address decode unit 16 is electrically bypassed such that there is no decoding of the addressing information performed. The memory unit 12 automatically selects the memory cell that is sequentially adjacent or next to the cell previously selected.

Figure 5:
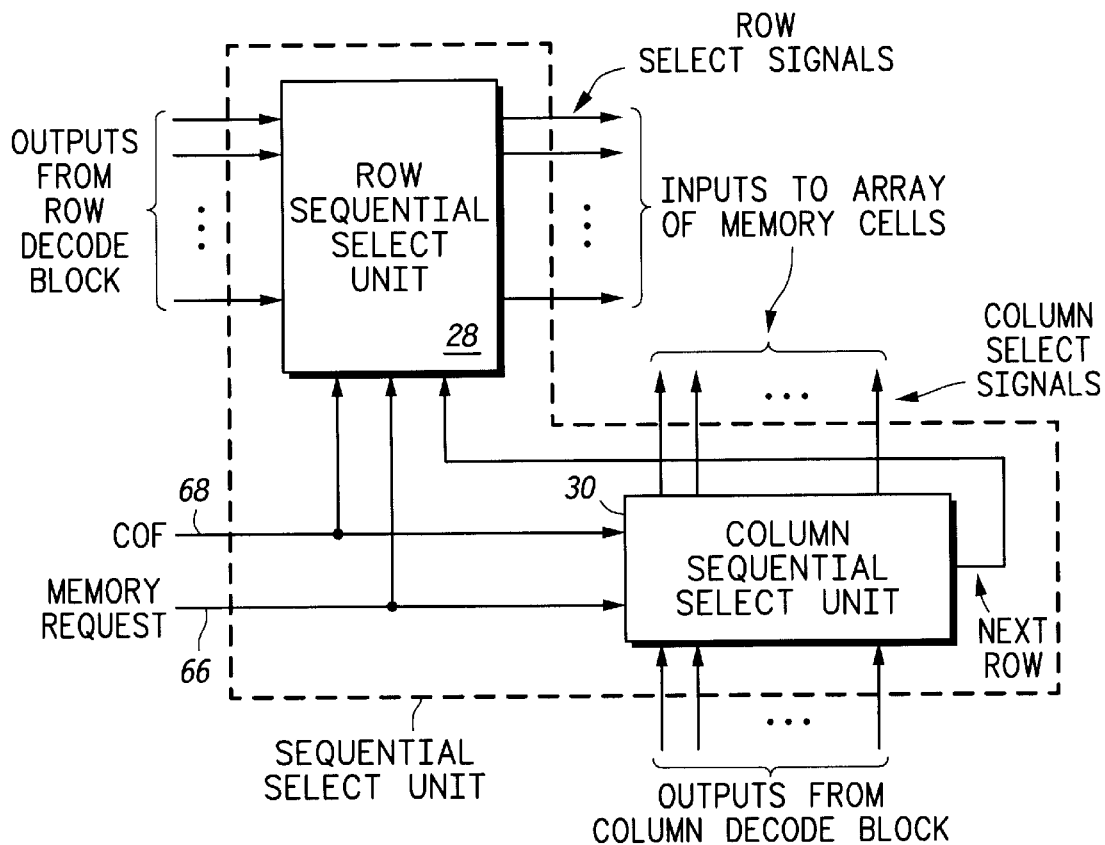
FIG. 5 is a schematic representation of a sequential select unit including a row sequential select unit and a column sequential select unit of the apparatus of FIG. 4.

Referring to FIG. 5, a schematic block diagram of the sequential select unit 26 comprising the row sequential select unit 28 and the column sequential select unit 30 is illustrated. As shown in FIG. 5, the row sequential select unit 28 receives input signals from the outputs of the row decode block 18 and the column sequential select unit 30, similarly, receives input signals from the outputs of the column decode block 20. Moreover, the COF and the memory request signals are provided to the row and column sequential select units 30.

Figure 6:
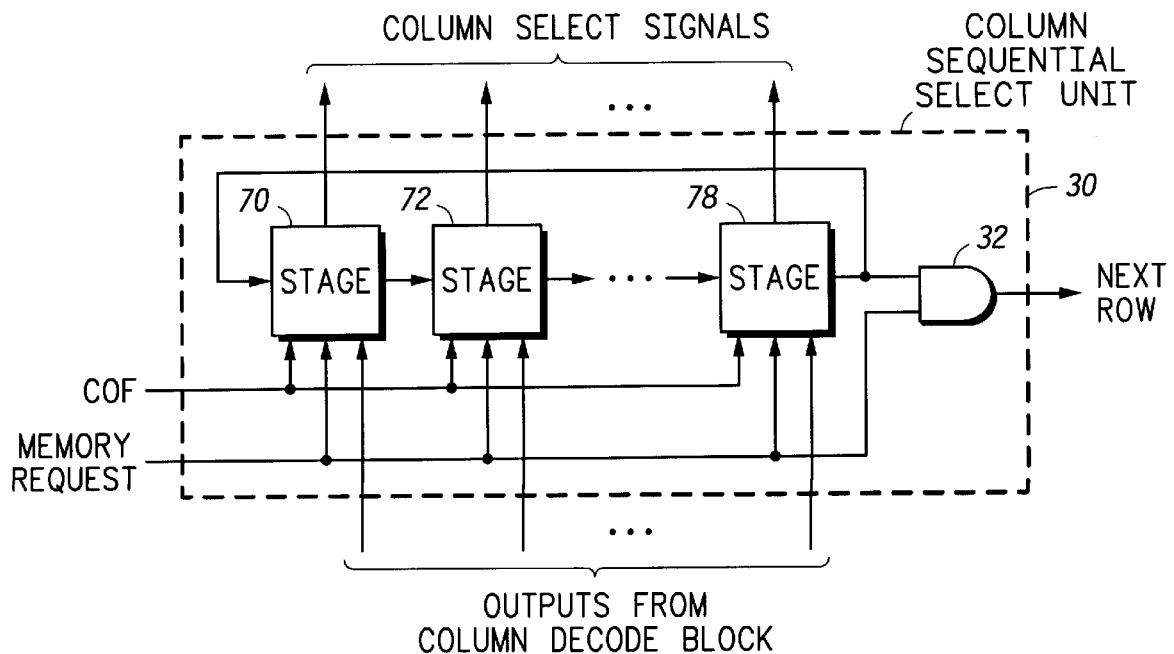
FIG. 6 is a detailed schematic block diagram representation of the column sequential select unit of FIG. 5.

FIG. 6 provides a more detailed schematic block diagram of the column sequential select unit 30. The column sequential select unit 30 includes a plurality of stages (70, 72, . . . , 78), wherein each stage may provide a column select signal for selecting a column in the memory cell array 14. The inputs to each stage are the COF, memory request, and the outputs from the column decode block 20. A signal from the output of the last stage 78 is fed back to the input of the first stage 70 in order to provide for the sequential selection of the columns in the memory cell array 14. Furthermore, the signal from the output of the last stage 78 is provided to a first input an AND gate 32 and the memory request signal provides the second input of the AND gate 32. The output of the AND gate 32 provides a Next Row signal used in sequentially selecting a next row of the memory cell array 14.

Figure 7:
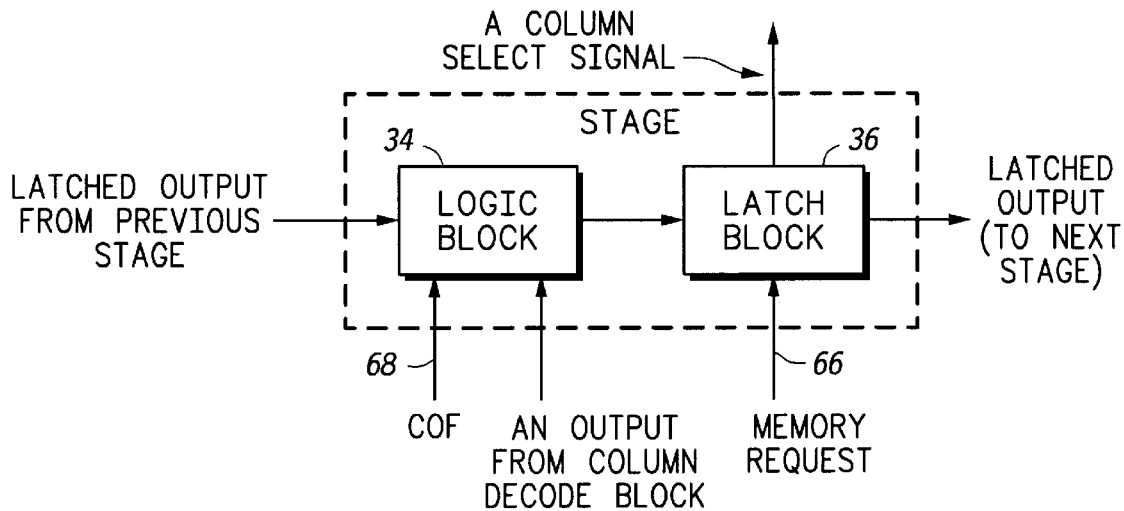
FIG. 7 is a block diagram representation of a single stage of a plurality of stages in the column sequential select unit of FIG. 6.

FIG. 7 illustrates a further detailed schematic block diagram of one embodiment of a single stage of the column sequential select unit 30. Each stage includes a logic block 34 and a latch block 36, wherein one of the outputs of the latch block 36 provides a column select signal. As shown in FIG. 7, each single stage receives an input signal from a previous stage and provides a signal output to a next stage. In this manner, each memory cell in a particular row is sequentially selected.

Figure 8:
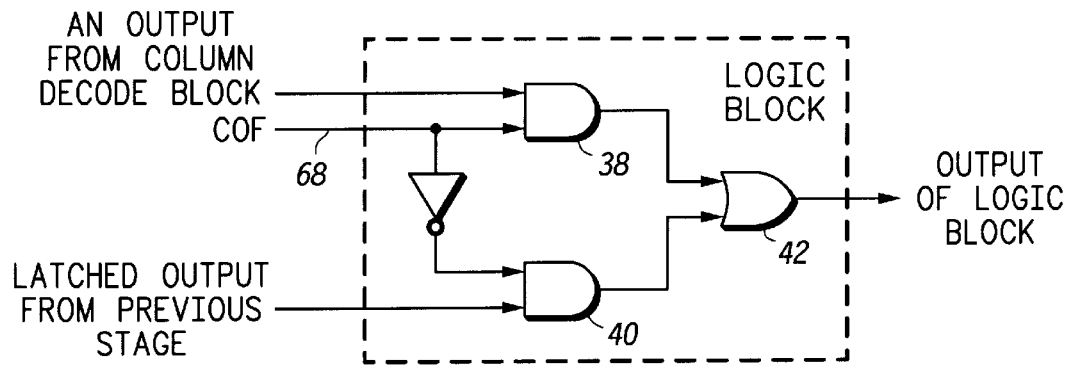
FIG. 8 is an exemplary representation of a logic arrangement of a logic block of FIG. 7.
Figure 9:
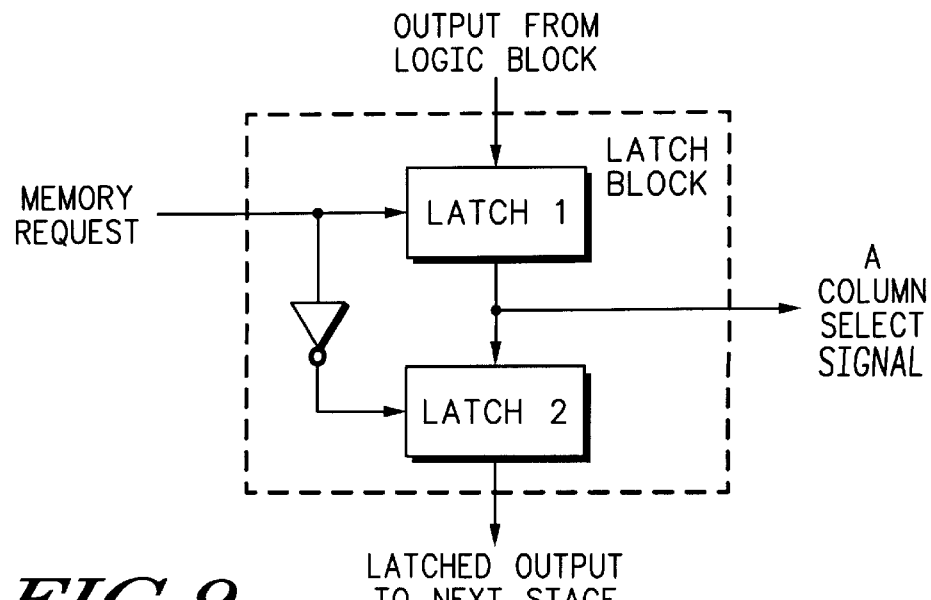
FIG. 9 is an exemplary representation of a logic arrangement of a latch block of FIG. 8.

FIG. 8 illustrates one embodiment of the details of the logic gates arrangement in the logic block 34. An output signal from the column decode block 20 with the COF signal are connected to an AND gate 38, while the inverted COF signal is supplied together with a latched output from a previous stage to another AND gate 40. The output of the AND gate 38 and the AND gate 40 are connected to the inputs of an OR gate 42. In this manner, depending on whether the COF signal is asserted or not, either an output from the column decode block 20 or a latched output from a previous stage is used for selecting a column location in the memory cell array 14. The output of one embodiment of the logic block 34 is provided to the latch block 36. A detailed schematic block diagram of the latch block 36 of a single stage of the column sequential select unit 30 is illustrated in FIG. 9. Controlled by the memory request signal, the output from the logic block 34 is latched and sequentially passed on from LATCH 1 to LATCH 2. The output of LATCH 2 is supplied to a next stage.

Figure 10:
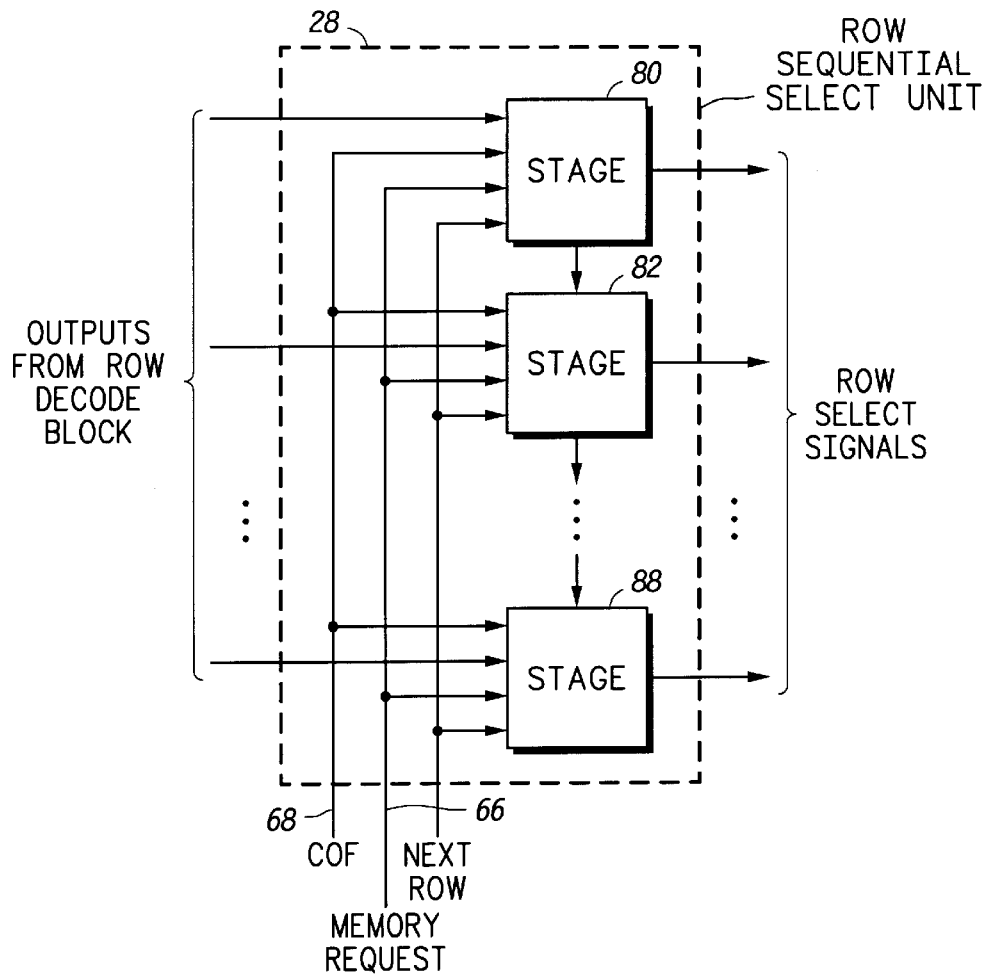
FIG. 10 is a detailed schematic block diagram representation of the row sequential select unit of FIG. 5.

Referring to FIG. 10, a schematic block diagram of the multiple stages of the row sequential select unit 28 is illustrated. The row sequential select unit 28 includes a plurality of stages (80, 82, . . . , 88), wherein each stage may provide a row select signal for selecting a row in the memory cell array 14. The inputs to each stage are the COF, memory request, outputs from row decode block 18, and the Next Row signal from the output of the AND gate 32 at the output of the last stage of the column sequential select unit 30.

Figure 11:
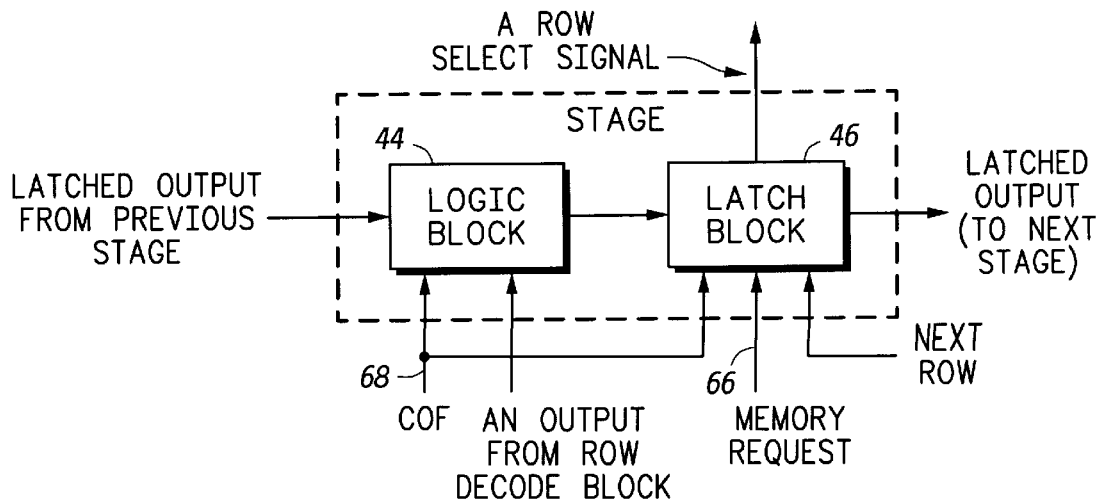
FIG. 11 is a block diagram representation of a single stage of a plurality of stages in the row sequential select unit of FIG. 10.

FIG. 11 illustrates a further detailed schematic block diagram of one embodiment of a single stage of the row sequential select unit 28. Each stage includes a logic block 44 and a latch block 46, wherein one of the outputs of the latch block 46 provides a row select signal. As shown in FIG. 11, each single stage receives an input signal from a previous stage and provides a signal output to a next stage. In this manner, each row in the memory cell array 14 may be sequentially selected.

Figure 12:
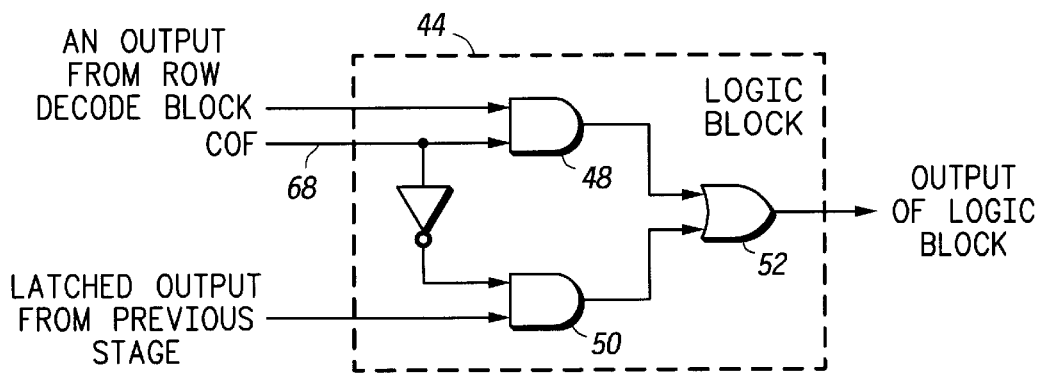
FIG. 12 is an exemplary representation of a logic arrangement of a logic block of FIG. 11.

FIG. 12 illustrates the details of one embodiment of the logic gates arrangement in the logic block 44 of a single stage of the row sequential select unit 28. An output signal from the row decode block 18 and the COF signal are connected to an AND gate 48, while the inverted COF signal is supplied together with a latched output from a previous stage to another AND gate 50. The output of the AND gate 48 and the AND gate 50 are input into an OR gate 52. In this manner, depending on whether the COF signal is asserted or not, either an output from the row decode block 18 or a latched output from a previous stage is used for selecting a row location in the memory cell array 14. The output of the logic block 44 is provided to the latch block 46.

Figure 13:
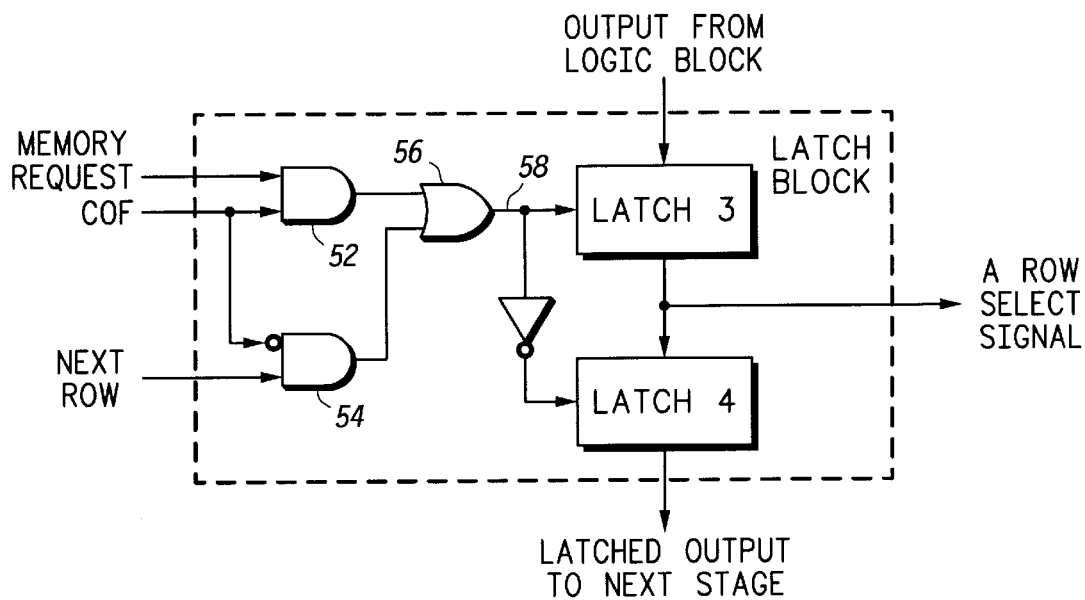
FIG. 13 is an exemplary representation of a logic arrangement of a latch block of FIG. 11.

A detailed schematic block diagram of the latch block 46 of a single stage of the row sequential select unit 28 is illustrated in FIG. 13. Utilizing the memory request signal, the COF signal, and the Next Row signal and the circuit arrangement of a pair of logic AND gates 52 and 54, and an OR gate 56, a control signal 58 is produced for controlling the latching operation of the signal from the output of the logic block 44. One embodiment of the above-mentioned circuit arrangement is provided by providing the memory request signal and the COF signal to the inputs of the first AND gate 52, and an inverted COF signal and the Next row signal to the inputs of the second AND gate 54. Furthermore, the outputs of the first AND gate 52 and the second AND gate 54 are provided to a first OR gate 56. The first OR gate 56 produces the control signal 58 for controlling the latching operation of the signal from the output of the logic block 44. Referring to FIGS. 12 and 13, in the event the COF signal is asserted and the memory request signal is provided from the CPU 10, then an output from the row decode block 18 is used for selecting a predetermined row in the memory cell array 14. In contrast, however, when the COF is not asserted, then the latched output from a previous stage is provided as the output of the logic block 44. As shown in FIG. 13, depending on whether or not there is a Next Row signal, the latch block 46 may or may not provide a row select signal for sequentially selecting a row. The LATCH 3 and LATCH 4 arrangement shown in FIG. 13 is similar to the arrangement of the latches discussed in FIG. 9. The output from the logic block 44 is latched and sequentially passed on from LATCH 3 to LATCH 4. The output of LATCH 4 is supplied to a next stage of the row sequential select unit 28.

In the present embodiment, the memory unit 12 automatically and sequentially selects memory cells that are arranged in a row of the memory cell array 14 by shifting through the columns from left to the most-right column in the array. The memory unit 12 then shifts to the next row below the previously selected row. In this manner, the memory unit 12 sequentially selects the memory cells from left to right and top to bottom in the memory array unit. It should be noted, however, that the present invention is not limited to the above-mentioned manner of sequential selection of the memory cells. It is contemplated that the sequential selection of the memory cells may be implemented by selecting the memory cells from the right to the left in any row, and from the bottom to the top of any column, or any other predetermined manner of sequentially accessing the memory cells in a memory array unit.

As mentioned above, for example, when a branching instruction is to be performed by the CPU 10 during the execution of a program, then the COF signal is asserted. The COF signal is asserted by the CPU 10 to inhibit the sequential selection of the memory cells in the memory cell array 14. When the COF signal is asserted by the CPU 10, the row decode block 18 and the column decode block 20 in the address decode unit 16 are used to decode an address information from at least one addressing signal received from the CPU 10 via the address lines. Asserting the COF signal also causes the sequential select unit 26 to "reset" by latching the decoded addressing signal from the row decode block 18 and the column decode block 20 outputs. In this manner, the automatic and sequential selection operation of the memory unit 12 is inhibited and instead a predetermined memory cell in the memory array unit is selected using the decoded address information from the row and column decode blocks.

The apparatus of the present invention can be implemented in various electronic devices such as computers, wireless communication devices, namely, cellular telephones, pagers, and the like.

In one embodiment, when utilizing the conventional CPU-memory arrangement described above, there are 225,333 cycles of addressing/accessing the memory unit, whereas when utilizing the apparatus of the present invention, there are 126,782 cycles of addressing/accessing the memory unit during an eleven seconds of pager simulation. This benchmark data indicates that forty-four percent of the memory accesses are sequential, which indicates that nearly half of the time the sequential select unit 26 is utilized rather than the address decode unit 16 to access a memory cell. Since sequential access operations in the present invention do not require the address lines to be driven, or to be decoded in the address decode unit, a significant power savings is achieved.

Furthermore, the present invention provides for a reduction in the electromagnetic interference (EMI) and noise in the electronic devices since the transitioning of logic elements are reduced as a result of the sequential accessing arrangement described above.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. An apparatus for accessing information in at least one memory unit, comprising:

a) a central processing unit for providing at least one addressing signal, a change of flow signal, and a memory request signal; and b) at least one memory unit having a memory cell array, wherein when the memory request signal is asserted, the at least one memory unit sequentially selects a plurality of memory cells in the memory cell array for accessing information therein, and wherein when the change of flow signal is asserted, a sequential selection of the plurality of memory cells by the at least one memory unit is inhibited and a predetermined memory cell is selected, determined by the at least one addressing signal, for accessing information in the predetermined memory cell; and c) a sequential select unit comprising a row sequential select unit coupled to a column sequential select unit, wherein each of the row sequential select unit and the column sequential select unit are responsive to the change of flow signal and the memory request signal for sequentially selecting the plurality of memory cells in the memory cell array.

2. The apparatus of claim 1, wherein the at least one memory unit further comprises an address decode unit responsive to the at least one addressing signal for selecting the predetermined memory cell.

3. The apparatus of claim 2, wherein the address decode unit comprises a row decode block and a column decode block, wherein the row decode block is electrically connected to the row sequential select unit and the column decode block is electrically connected to the column sequential select unit.

4. A method for accessing information in at least one memory unit, the method comprising the steps of:

a) providing a central processing unit for providing at least one addressing signal, a change of flow signal, and a memory request signal;

b) providing at least one memory unit having a memory cell array, wherein when the memory request signal is asserted, the at least one memory unit sequentially selects a plurality of memory cells in the memory cell array for accessing the information therein, and wherein when the change of flow signal is asserted, the sequential selection of the plurality of memory cells by the at least one memory unit is inhibited and a predetermined memory cell is selected, determined by the at least one addressing signal, for accessing information in the predetermined memory cell; and c) utilizing a sequential select unit comprising a row sequential select unit and a column sequential select unit responsive to the change of flow signal and the memory request signal for sequentially selecting the plurality of memory cells in the memory cell array.

5. The method of claim 4, wherein the step of providing at least one memory unit includes a step of:

utilizing an address decode unit responsive to the at least one addressing signal for selecting the predetermined memory cell.

6. The method of claim 5, wherein the step of utilizing an address decode unit includes a step of:

providing a row decode block and a column decode block for selecting the predetermined memory cell, determined by the at least one addressing signal.

* * * * *